(12) United States Patent
Sunaga et al.

(10) Patent No.: US 11,712,695 B2
(45) Date of Patent: Aug. 1, 2023

(54) FLUID HANDLING DEVICE AND FLUID HANDLING SYSTEM

(71) Applicant: Enplas Corporation, Saitama (JP)

(72) Inventors: Nobuya Sunaga, Saitama (JP); Takumi Yamauchi, Saitama (JP); Satomi Yabuuchi, Saitama (JP)

(73) Assignee: Enplas Corporation, Saitama (JP)

( * ) Notice: Subject to any disclaimer, the term of this patent is extended or adjusted under 35 U.S.C. 154(b) by 330 days.

(21) Appl. No.: 17/042,989

(22) PCT Filed: Mar. 28, 2019

(86) PCT No.: PCT/JP2019/013502
§ 371 (c)(1),
(2) Date: Sep. 29, 2020

(87) PCT Pub. No.: WO2019/189540
PCT Pub. Date: Oct. 3, 2019

(65) Prior Publication Data
US 2021/0008551 A1    Jan. 14, 2021

(30) Foreign Application Priority Data

Mar. 29, 2018 (JP) .................................. 2018-065032

(51) Int. Cl.
*B01L 3/00* (2006.01)
(52) U.S. Cl.
CPC . *B01L 3/502738* (2013.01); *B01L 2200/0621* (2013.01); *B01L 2400/0666* (2013.01)
(58) Field of Classification Search
CPC ..... B01L 2300/0867; B01L 2400/0644; B01L 2400/0655; B01J 19/00; B81B 3/00; G01N 35/08; G01N 37/00
See application file for complete search history.

(56) References Cited

U.S. PATENT DOCUMENTS

| 9,188,243 B2 * | 11/2015 | Addae-Mensah ............................ F16K 99/0061 |
| 2011/0114869 A1 * | 5/2011 | Schaeffer ............ F16K 99/0001 251/366 |
| 2013/0086998 A1 * | 4/2013 | Lee ................... B01L 3/502753 73/863.24 |

FOREIGN PATENT DOCUMENTS

| JP | 2007085537 A * | 4/2007 |
| JP | 2007085537 A   | 4/2007 |

(Continued)

OTHER PUBLICATIONS

International Search Report from International Application No. PCT/JP2019/013502, dated Jun. 11, 2019.

*Primary Examiner* — Dennis White
*Assistant Examiner* — Peter Valentin Diaz
(74) *Attorney, Agent, or Firm* — Shih IP Law Group, PLLC

(57) ABSTRACT

A flow channel chip has: a common flow channel; introduction flow channels that are respectively connected to the common flow channel; introduction valves that are respectively disposed in the introduction flow channels; a cleaning liquid flow channel that is connected to the common flow channel; and a cleaning liquid valve that is disposed in the cleaning liquid flow channel. This fluid handling device has: a rotary member for controlling opening/closing of the introduction valves; and a cleaning liquid valve control unit for controlling opening/closing of the cleaning liquid valve. After the rotary member is rotated so as to open/close one of the introduction valves, the cleaning liquid valve control unit causes the cleaning liquid valve to open and causes the cleaning liquid to flow in the common flow channel before the rotary member is rotated so as to open/close another of the introduction valves.

5 Claims, 15 Drawing Sheets

(56) References Cited

FOREIGN PATENT DOCUMENTS

| WO | WO-0241994 A2 | * | 5/2002 | ........... B01F 11/0071 |
| WO | WO-2012126646 A1 | * | 9/2012 | ......... B01L 3/502738 |

* cited by examiner

FLUID HANDLING DEVICE AND FLUID HANDLING SYSTEM

TECHNICAL FIELD

The present invention relates to a fluid handling device configured to control fluid in a channel of a channel chip including a plurality of valves, and a fluid handling system including the channel chip and the fluid handling device.

BACKGROUND ART

In recent years, a channel chip is used to analyze trace amounts of substances such as proteins and nucleic acids with high precision and speed. Advantageously, a channel chip requires only a small amount of sample or reagent required for an analysis, and is expected to be used for various uses such as laboratory tests, food tests, and environment tests. For example, PTL 1 discloses a micro valve unit that includes a channel chip including a plurality of micro valves, and a pressing part for controlling the opening and closing of the micro valves. In the channel chip, the micro valves are disposed on the same circumference. In addition, the pressing part includes a contact surface having an arc-like shape in plan view. When the pressing part is rotated, the contact surface of the pressing part moves. In this manner, the diaphragm of the micro valve is pressed, or not pressed by the pressing part. The micro valve is closed when pressed by the pressing part, and the micro valve is open when not pressed by the pressing part.

CITATION LIST

Patent Literature

PTL 1
Japanese Patent Application Laid-Open No. 2007-85537

SUMMARY OF INVENTION

Technical Problem

As described above, in the device (micro valve unit) disclosed in PTL 1, a rotary member (pressing part) including a protrusion (end surface) having an arc-like shape in plan view is rotated to control the opening and closing of the valves (micro valves). When the channel chip includes a plurality of valves in such a device, the valves may not be opened and closed in the intended order. This problem is described below with reference to FIGS. 1A to 2B.

FIG. 1A is a plan view of a channel chip for describing a problem of a known technique. FIG. 1B is a bottom view of a rotary member combined with the channel chip illustrated in FIG. 1A. As illustrated in FIG. 1A, the channel chip includes first inlet 10, first introduction channel 11, first valve 12, second inlet 20, second introduction channel 21, second valve 22, third inlet 30, third introduction channel 31, third valve 32, common channel 40 and outlet 41. The upstream end of first introduction channel 11 is connected to first inlet 10, and the downstream end of first introduction channel 11 is connected to the upstream end of common channel 40. The upstream end of second introduction channel 21 is connected to second inlet 20, and the downstream end of second introduction channel 21 is connected to the upstream end of common channel 40. The upstream end of third introduction channel 31 is connected to third inlet 30, and the downstream end of third introduction channel 31 is connected to the upstream end of common channel 40. First introduction channel 11, second introduction channel 21 and third introduction channel 31 are provided with first valve 12, second valve 22 and third valve 32, respectively. The downstream end of common channel 40 is connected to outlet 41.

In addition, as illustrated in FIG. 1B, the rotary member includes protrusion 50 having an arc-like shape in plan view for pressing first valve 12, second valve 22 and third valve 32, and recess 51 disposed on the circumference same as that of the protrusion 50. In FIG. 1B, the bottom surface (the surface that makes contact with the channel chip) of protrusion 50 is hatched. First valve 12, second valve 22 and third valve 32 are closed when pressed by protrusion 50, but are open when not pressed by protrusion 50.

For example, as illustrated in FIG. 2A, the rotary member is rotated such that recess 51 is located over first valve 12 and that protrusion 50 is located over second valve 22 and third valve 32. In this case, first valve 12 is open, and the fluid in first inlet 10 can flow to outlet 41 through first introduction channel 11 and common channel 40. On the other hand, second valve 22 and third valve 32 are closed, and therefore the liquid in second inlet 20 and the fluid in third inlet 30 cannot flow toward outlet 41.

Thereafter, when it is desired to cause the fluid in third inlet 30 to flow toward outlet 41, the rotary member is rotated such that recess 51 is located over third valve 32 and that protrusion 50 is located over first valve 12 and second valve 22. However, as illustrated in FIG. 2B, while the rotary member is rotated, recess 51 is temporarily located over second valve 22 and protrusion 50 is temporarily located over first valve 12 and third valve 32. As a result, the fluid in second inlet 20 that is not intended to deliver may flow toward outlet 41.

In the case where a portion of the fluid in second inlet 20 flows toward outlet 41 in the above-mentioned manner, a plurality of types of liquid are unintentionally mixed in common channel 40 when the fluid in third inlet 30 is caused to flow toward outlet 41.

In this manner, in known devices, a plurality of types of liquid are unintentionally mixed in the common channel when the channel chip includes a plurality of valves.

An object of the present invention is to provide a fluid handling device that can suppress unintentional mixing of a plurality of types of liquid due to rotation of a rotary member even when the channel chip includes a plurality of valves. In addition, another object of the present invention is to provide a fluid handling system including the channel chip and the fluid handling device.

Solution to Problem

A fluid handling device of an embodiment of the present invention is configured to control fluid in a channel of a channel chip, wherein the channel chip includes: a common channel; a plurality of introduction channels connected to the common channel; a plurality of introduction valves disposed for the plurality of introduction channels, each of the plurality of introduction valves being disposed in each of the plurality of introduction channels or at a connecting portion between each of the plurality of introduction channels and the common channel; a washing solution channel connected to the common channel at a position upstream of the plurality of introduction channels; and a washing solution valve disposed in the washing solution channel or a connecting portion between the washing solution channel and the common channel; wherein the fluid handling device includes a rotary member rotatable around a central axis, the rotary member including: a first protrusion configured to close the plurality of introduction valves by pressing a diaphragm of each of the plurality of introduction valves; a first recess configured to open the plurality of introduction valves without pressing the diaphragm of each of the plurality of introduction valves, the first protrusion and the first recess being disposed on a circumference of a first circle around the central axis; and a washing solution valve control part configured to control opening and closing of the washing solution valve; and wherein the washing solution valve control part opens the washing solution valve to cause washing solution to flow in the common channel after the rotary member is rotated to open and close an introduction valve of the plurality of introduction valves and before the rotary member is rotated to open and close another introduction valve of the plurality of introduction valves.

A fluid handling system of an embodiment of the present invention includes: a channel chip; and the fluid handling device; wherein the channel chip includes: a common channel; a plurality of introduction channels connected to the common channel; a plurality of introduction valves disposed for the plurality of introduction channels, each of the plurality of introduction valves being disposed in each of the plurality of introduction channels or at a connecting portion between each of the plurality of introduction channels and the common channel; a washing solution channel connected to the common channel at a position upstream of the plurality of introduction channels; and a washing solution valve disposed in the washing solution channel or at a connecting portion between the washing solution channel and the common channel.

Advantageous Effects of Invention

According to the present invention, it is possible to suppress unintentional mixing of a plurality of types of liquid due to rotation of a rotary member even when the channel chip includes a plurality of valves.

DESCRIPTION OF EMBODIMENTS

Embodiments of the present invention are elaborated below with reference to the accompanying drawings.

Embodiment 1

Configuration of Fluid Handling Device and Channel Chip

Figure 1A:
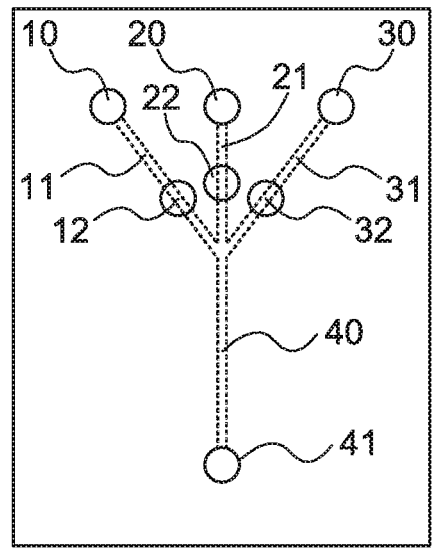
FIG. 1A is a plan view of a channel chip for describing a problem of a known technique.
Figure 1B:
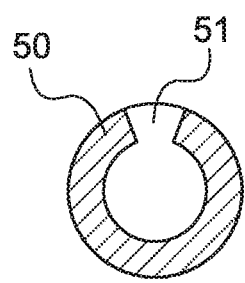
FIG. 1B is a bottom view of a rotary member combined with the channel chip illustrated in FIG. 1A.
Figure 2A:
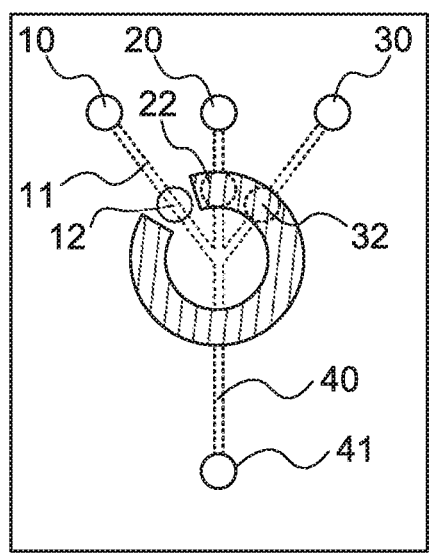
FIGS. 2A and 2B are schematic views illustrating an exemplary use of the channel chip illustrated in FIG. 1A and the rotary member illustrated in FIG. 1B.
Figure 2B:
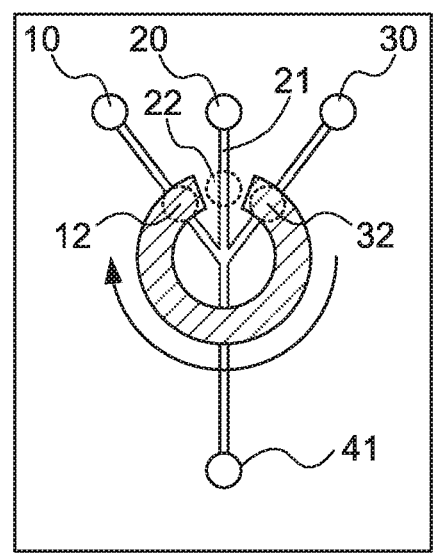
Figure 3:
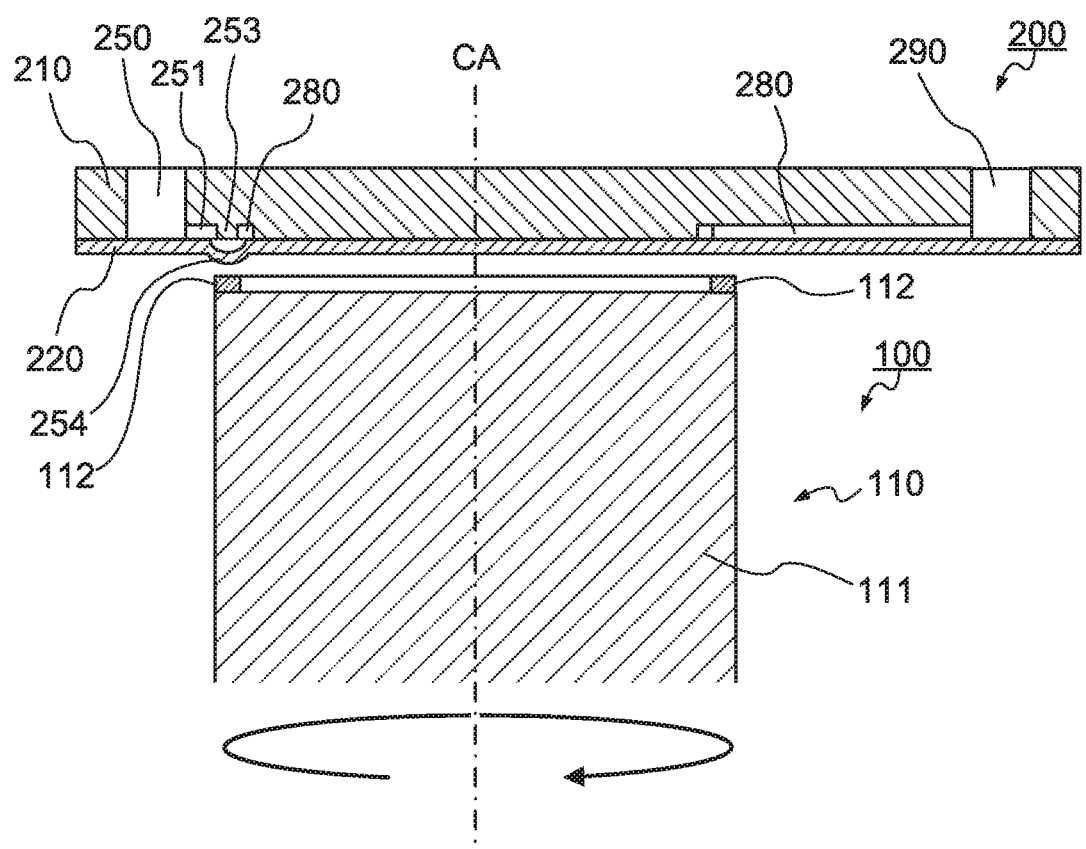
FIG. 3 is a sectional view illustrating a configuration of a fluid handling device and a channel chip according to Embodiment 1.
Figure 4:
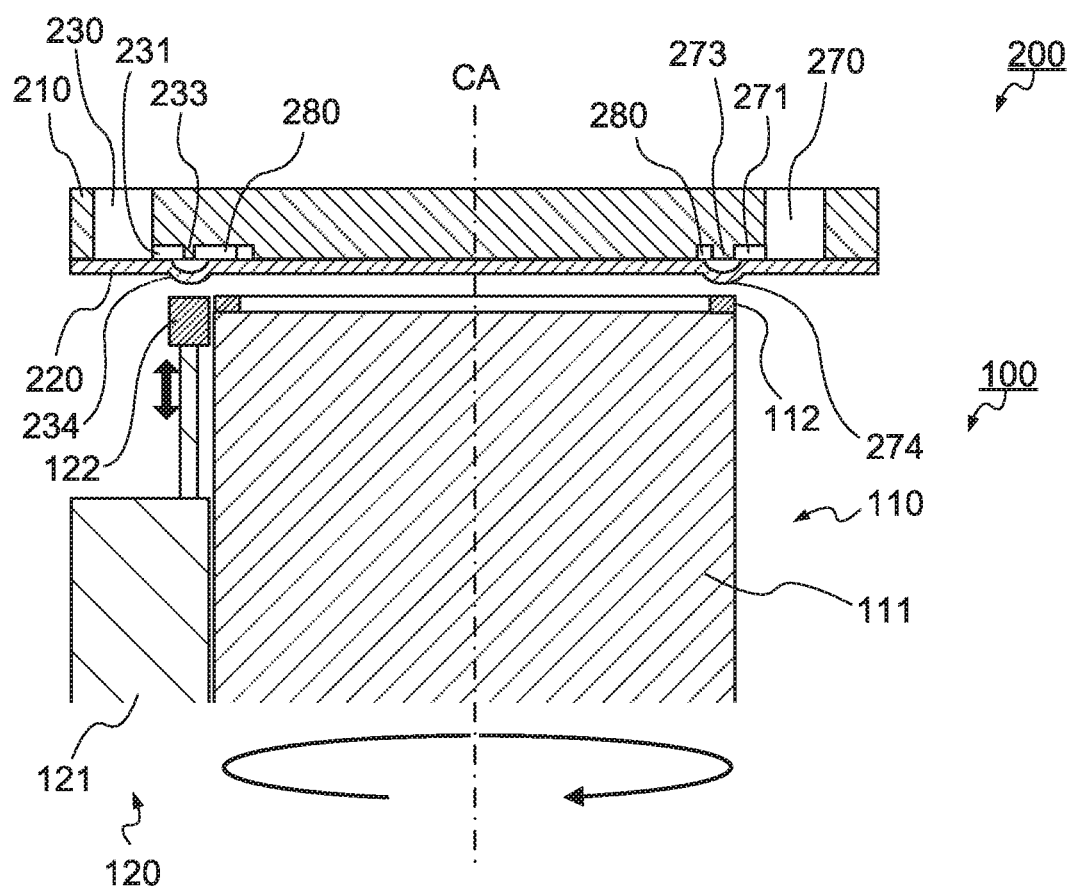
FIG. 4 is a sectional view illustrating a configuration of the fluid handling device and the channel chip according to Embodiment 1.
Figure 5:
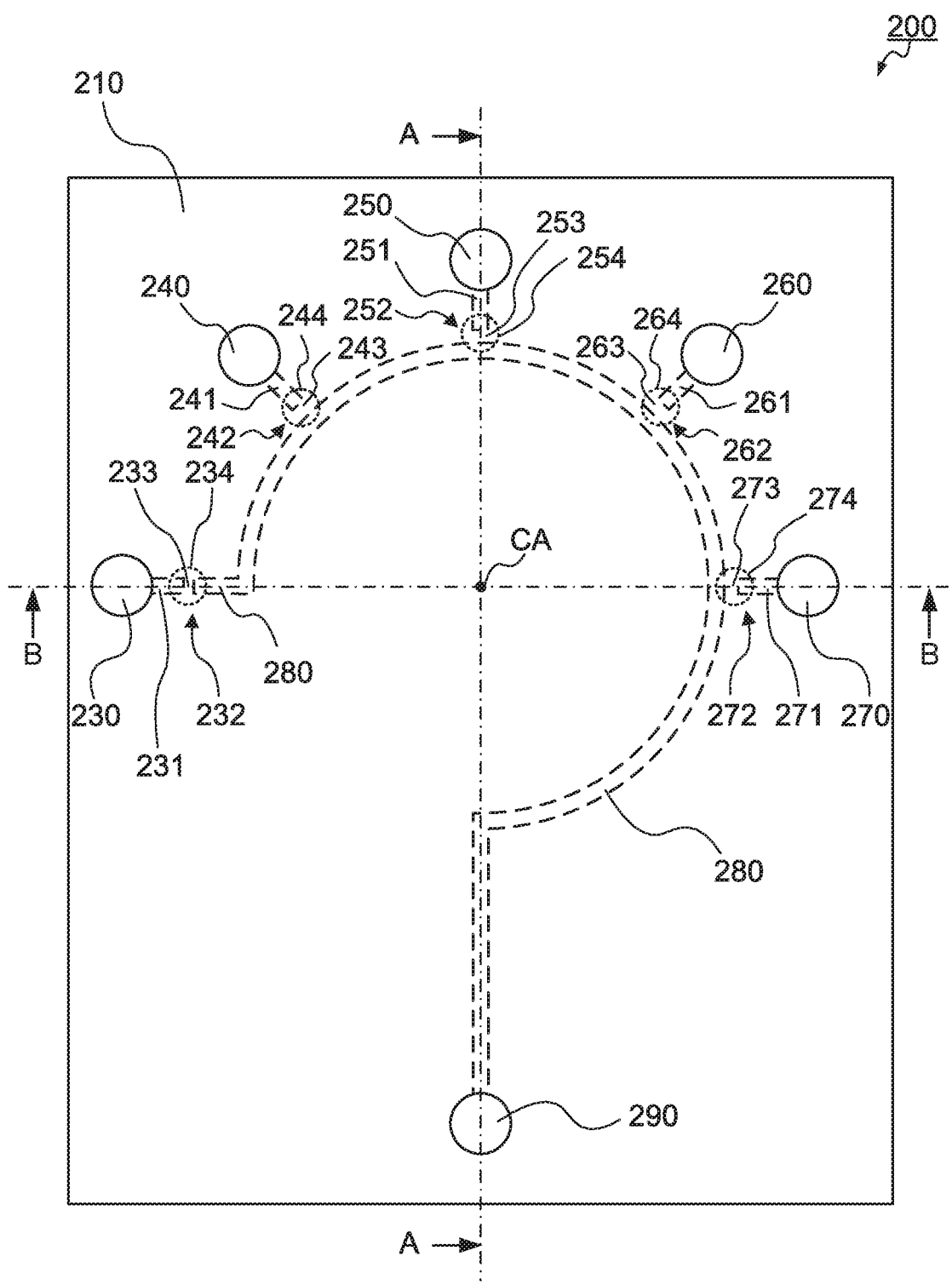
FIG. 5 is a plan view illustrating a configuration of the channel chip according to Embodiment 1.

FIGS. 3 and 4 are sectional views illustrating a configuration of a fluid handling system (fluid handling device 100 and channel chip 200) according to Embodiment 1. FIG. 3 is a sectional view taken along line A-A of FIG. 5, and FIG. 4 is a sectional view taken along line B-B of FIG. 5. As illustrated in FIGS. 3 and 4, fluid handling device 100 includes rotary member 110 and washing solution valve control part 120. Rotary member 110 is rotated around central axis CA by an external driving mechanism not illustrated in the drawing. Channel chip 200 includes substrate 210 and film 220, and is disposed to fluid handling device 100 such that film 220 is in contact with rotary member 110. In this specification, a combination of fluid handling device 100 and channel chip 200 is referred to also as "fluid handling system". Note that in FIGS. 3 and 4, fluid handling device 100 and channel chip 200 are separated away from each other for the sake of clarity of illustration of their configurations.

FIG. 5 is a plan view illustrating a configuration of channel chip 200 according to Embodiment 1. In FIG. 5, a groove (channel) formed in the surface of substrate 210 on film 220 side and a diaphragm formed in film 220 are illustrated with broken lines.

As described above, channel chip 200 includes substrate 210 and film 220 (see FIGS. 3 and 4). A groove configured to be a channel and a through hole configured to be an inlet or an outlet are formed in substrate 210. Film 220 is joined to one surface of substrate 210 so as to close the openings of the recess and the through hole formed in substrate 210. A partial region of film 220 functions as a diaphragm. The groove of substrate 210 closed with film 220 serves as a channel for carrying fluid such as reagent, liquid sample, washing solution, gas, and powder.

The thickness of substrate 210 is not limited. For example, the thickness of substrate 210 is 1 mm to 10 mm. In addition, the material of substrate 210 is not limited. For example, the material of substrate 210 may be appropriately selected from publicly known resins and glass. Examples of the material of substrate 210 include polyethylene terephthalate, polycarbonate, polymethylmethacrylate, polyvinyl chloride, polypropylene, polyether, polyethylene, polystyrene, silicone resin and elastomer.

The thickness of film 220 is not limited as long as it can serve as a diaphragm. For example, the thickness of film 220 is 30 μm to 300 μm. In addition, the material of film 220 is not limited as long as it can function as a diaphragm. For example, the material of film 220 may be appropriately selected from publicly known resins. Examples of the material of film 220 include polyethylene terephthalate, polycarbonate, polymethylmethacrylate, polyvinyl chloride, polypropylene, polyether, polyethylene, polystyrene, silicone resin and elastomer. Film 220 is joined to substrate 210 by thermal welding, laser welding, adhesive agent and the like, for example.

As illustrated in FIG. 5, channel chip 200 according to the present embodiment includes washing solution inlet 230, washing solution channel 231, washing solution valve 232, first inlet 240, first introduction channel 241, first introduction valve 242, second inlet 250, second introduction channel 251, second introduction valve 252, third inlet 260, third introduction channel 261, third introduction valve 262, fourth inlet 270, fourth introduction channel 271, fourth introduction valve 272, common channel 280 and outlet 290.

Washing solution inlet 230 is a bottomed recess for introducing washing solution. First inlet 240, second inlet 250, third inlet 260 and fourth inlet 270 are bottomed recesses for introducing fluid. In the present embodiment, each inlet is composed of a through hole formed in substrate 210 and film 220 closing one opening of the through hole. The shape and the size of each inlet are not limited and may be appropriately set as necessary. Each inlet has a substantially columnar shape, for example. Each inlet has a width of about 2 mm, for example. The type of the washing solution housed in washing solution inlet 230 is not limited, and may be appropriately selected in accordance with the type of the fluid introduced to first inlet 240, second inlet 250, third inlet 260 and fourth inlet 270. The washing solution is water or buffer solution, for example. The type of the fluid housed in first inlet 240, second inlet 250, third inlet 260 and fourth inlet 270 may be appropriately selected in accordance with the use of channel chip 200. The fluid is fluid such as reagent, liquid sample and powder.

Washing solution channel 231 is a channel in which washing solution can move. First introduction channel 241, second introduction channel 251, third introduction channel 261 and fourth introduction channel 271 are channels in which fluid can move. The upstream ends of washing solution channel 231, first introduction channel 241, second introduction channel 251, third introduction channel 261 and fourth introduction channel 271 are connected to washing solution inlet 230, first inlet 240, second inlet 250, third inlet 260 and fourth inlet 270, respectively. The downstream ends of washing solution channel 231, first introduction channel 241, second introduction channel 251, third introduction channel 261 and fourth introduction channel 271 are connected to common channel 280 at respective positions different from each other. Note that washing solution channel 231 is connected to common channel 280 at a position upstream of first introduction channel 241, second introduction channel 251, third introduction channel 261 and fourth introduction channel 271. In the present embodiment, each channel is composed of a groove formed in substrate 210, and film 220 closing the opening of the groove. The cross-sectional area and the cross-sectional shape of each channel are not limited. In this specification, "cross-section of channel" means a cross-section of the channel orthogonal to the direction in which the fluid flows. The cross-sectional shape of each channel is a substantially rectangular shape with each side (width and depth) having a length of about several tens of micrometers, for example. The cross-sectional area of each channel may be or may not be constant in the flow direction of the fluid. In the present embodiment, the cross-sectional area of each channel is constant.

Washing solution valve 232 is a diaphragm valve that controls flow of the washing solution in washing solution channel 231. First introduction valve 242, second introduction valve 252, third introduction valve 262 and fourth introduction valve 272 are diaphragm valves configured to control the flow of the fluid in first introduction channel 241, second introduction channel 251, third introduction channel 261 and fourth introduction channel 271, respectively. Washing solution valve 232 is disposed in washing solution channel 231 or at a connecting portion between washing solution channel 231 and common channel 280. First introduction valve 242 is disposed in first introduction channel 241 or at a connecting portion between first introduction channel 241 and common channel 280. Second introduction valve 252 is disposed in second introduction channel 251 or at a connecting portion between second introduction channel 251 and common channel 280. Third introduction valve 262 is disposed in third introduction channel 261 or at a connecting portion between third introduction channel 261 and common channel 280. Fourth introduction valve 272 is disposed in fourth introduction channel 271 or at a connecting portion between fourth introduction channel 271 and common channel 280. In the present embodiment, washing solution valve 232 is disposed at a connecting portion between washing solution channel 231 and common channel 280. In addition, first introduction valve 242 is disposed at a connecting portion between first introduction channel 241 and common channel 280, second introduction valve 252 is disposed at a connecting portion between second introduction channel 251 and common channel 280, third introduction valve 262 is disposed at a connecting portion between third introduction channel 261 and common channel 280, and fourth introduction valve 272 is disposed at a connecting portion between fourth introduction channel 271 and common channel 280. In addition, first introduction valve 242, second introduction valve 252, third introduction valve 262 and fourth introduction valve 272 are disposed on the circumference of a circle around central axis CA. On the other hand, washing solution valve 232 is disposed such that washing solution valve 232 is not located on the circumference of the circle. In the present embodiment, washing solution valve 232 is disposed outside the circle.

Washing solution valve 232 includes partition wall 233 and diaphragm 234. Likewise, first introduction valve 242 includes first partition wall 243 and first diaphragm 244, second introduction valve 252 includes second partition wall 253 and second diaphragm 254, third introduction valve 262 includes third partition wall 263 and third diaphragm 264, and fourth introduction valve 272 includes fourth partition wall 273 and fourth diaphragm 274. In the present embodiment, partition wall 233 is disposed between washing solution channel 231 and common channel 280. Likewise, first partition wall 243 is disposed between first introduction channel 241 and common channel 280, second partition wall 253 is disposed between second introduction channel 251 and common channel 280, third partition wall 263 is disposed between third introduction channel 261 and common channel 280, and fourth partition wall 273 is disposed between fourth introduction channel 271 and common channel 280. In addition, diaphragm 234 is disposed opposite to partition wall 233. Likewise, first diaphragm 244 is disposed opposite to first partition wall 243, second diaphragm 254 is disposed opposite to second partition wall 253, third diaphragm 264 is disposed opposite to third partition wall 263, and fourth diaphragm 274 is disposed opposite to fourth partition wall 273.

Partition wall 233 functions as a valve seat of a diaphragm valve for opening and closing between washing solution channel 231 and common channel 280. Likewise, first partition wall 243 functions as a valve seat of a diaphragm valve for opening and closing between first introduction channel 241 and common channel 280, second partition wall 253 functions as a valve seat of a diaphragm valve for opening and closing between second introduction channel 251 and common channel 280, third partition wall 263 functions as a valve seat of a diaphragm valve for opening and closing between third introduction channel 261 and common channel 280, and fourth partition wall 273 functions as a valve seat of a diaphragm valve for opening and closing between fourth introduction channel 271 and common channel 280. The shape and the height of each partition wall are not limited as long as the above-mentioned function can be ensured. The shape of each partition wall is a rectangular prism shape, for example. The height of each partition wall is the same as the depth of each channel, for example.

Each of diaphragm 234, first diaphragm 244, second diaphragm 254, third diaphragm 264 and fourth diaphragm 274 is a portion of film 220 having flexibility and has a substantially spherical cap shape (see FIGS. 3 and 4). Film 220 is disposed on substrate 210 such that each diaphragm is opposite to the corresponding partition wall without making contact with the partition wall.

When pressed by protrusion 112 (described later) of rotary member 110, first diaphragm 244, second diaphragm 254, third diaphragm 264 and fourth diaphragm 274 deflect toward the corresponding partition walls (see FIGS. 3 and 4). In this manner, each diaphragm functions as a valve element of a diaphragm valve. For example, when protrusion 112 is not pressing first diaphragm 244, first introduction channel 241 and common channel 280 are communicated with each other through the gap between first diaphragm 244 and first partition wall 243. On the other hand, when protrusion 112 is pressing first diaphragm 244 such that first diaphragm 244 makes contact with first partition wall 243, first introduction channel 241 and common channel 280 are not communicated with each other.

On the other hand, diaphragm 234 of washing solution valve 232 deflects toward partition wall 233 when pressed by contact part 122 (described later) of washing solution valve control part 120 (see FIG. 4). In this manner, diaphragm 234 functions as a valve element of a diaphragm valve. For example, when contact part 122 is not pressing diaphragm 234, washing solution channel 231 and common channel 280 are communicated with each other through the gap between diaphragm 234 and partition wall 233. On the other hand, when contact part 122 is pressing diaphragm 234 such that diaphragm 234 makes contact with partition wall 233, washing solution channel 231 and common channel 280 are not communicated with each other.

Common channel 280 is a channel in which fluid can move. Common channel 280 is connected to washing solution channel 231 through washing solution valve 232, is connected to first introduction channel 241 through first introduction valve 242, is connected to second introduction channel 251 through second introduction valve 252, is connected to third introduction channel 261 through third introduction valve 262, and is connected to fourth introduction channel 271 through fourth introduction valve 272. Accordingly, washing solution introduced to washing solution inlet 230, fluid introduced to first inlet 240, fluid introduced to second inlet 250, fluid introduced to third inlet 260, and fluid introduced to fourth inlet 270 flow through common channel 280. As described above, washing solution channel 231 is connected to common channel 280 at a position upstream of common channel 280 relative to first introduction channel 241, second introduction channel 251, third introduction channel 261 and fourth introduction channel 271. The downstream end of common channel 280 is connected to outlet 290. In the present embodiment, common channel 280 is composed of a groove formed in substrate 210, and film 220 closing the opening of the groove. The cross-sectional area and the cross-sectional shape of common channel 280 are not limited. The cross-sectional shape of common channel 280 is a substantially rectangular shape with each side (width and depth) having a length of about several tens of micrometers, for example. The cross-sectional area of common channel 280 may be or may not be constant in the flow direction of the fluid. In the present embodiment, the cross-sectional area of common channel 280 is constant.

Outlet 290 is a bottomed recess. Outlet 290 functions as an air hole, and as an ejection port for ejecting fluid in common channel 280. In the present embodiment, outlet 290 is composed of a through hole formed in substrate 210, and film 220 closing one opening of the through hole. The shape and the size of outlet 290 are not limited, and may be appropriately set as necessary. The shape of outlet 290 is a substantially columnar shape, for example. The width of outlet 290 is about 2 mm, for example.

Figure 6A:
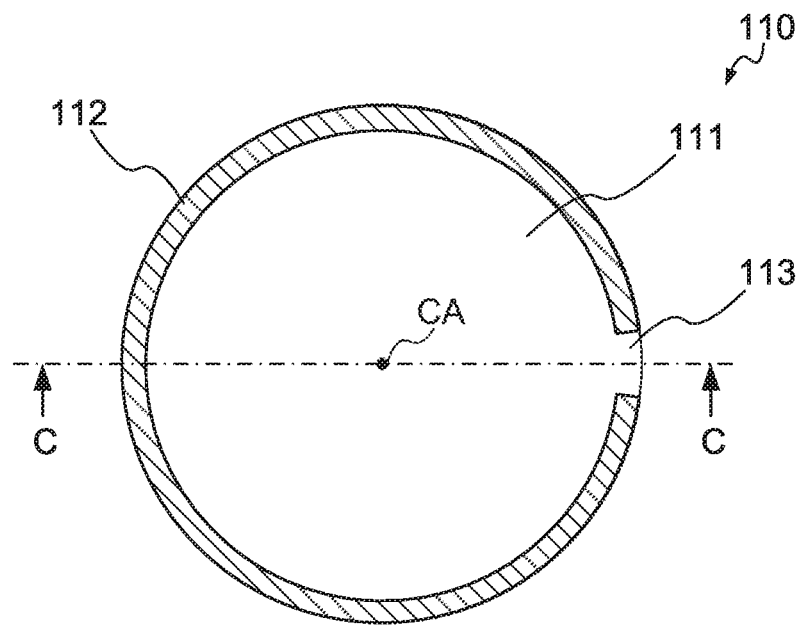
FIG. 6A is a plan view of a rotary member of the fluid handling device according to Embodiment 1.
Figure 6B:
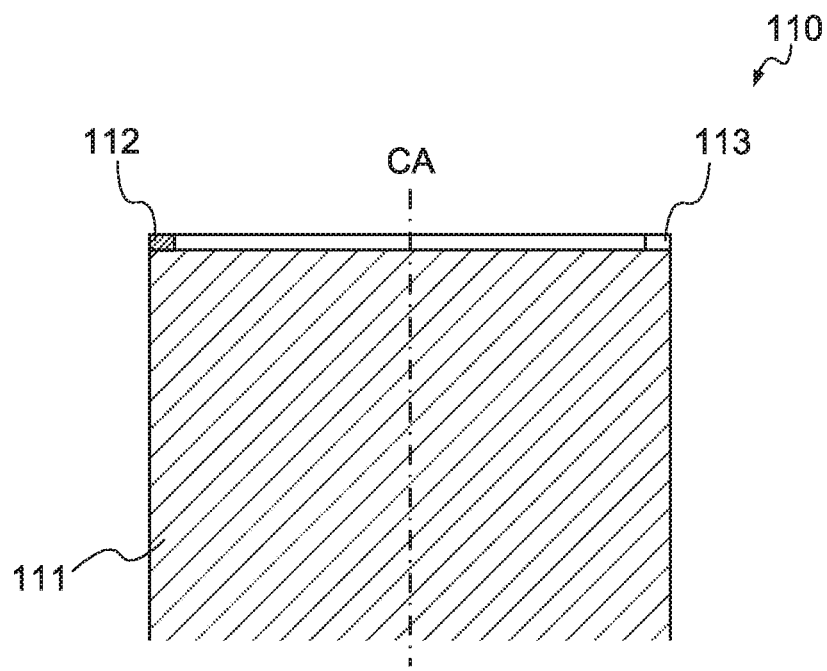
FIG. 6B is a sectional view taken along line C-C of FIG. 6A.

FIG. 6A is a plan view of rotary member 110 of fluid handling device 100 according to Embodiment 1, and FIG. 6B is a sectional view taken along line C-C of FIG. 6A. In FIG. 6A, for the sake of clarity, the top surface of protrusion 112 is hatched.

Rotary member 110 includes columnar body 111, protrusion 112 disposed on the top surface of body 111, and recess 113 disposed in the top surface of body 111. Body 111 is rotatable around central axis CA. Body 111 is rotated by an external driving mechanism not illustrated in the drawing.

In the upper part of body 111, protrusion 112 configured to close first diaphragm 244, second diaphragm 254, third diaphragm 264 or fourth diaphragm 274 by pressing first introduction valve 242, second introduction valve 252, third introduction valve 262 or fourth introduction valve 272, and recess 113 configured to open these introduction valves without pressing the diaphragms are provided. Protrusion 112 and recess 113 are disposed on the circumference of the first circle around central axis CA. In the present embodiment, protrusion 112 has an arc-like shape corresponding to a portion of the first circle around central axis CA in plan view. The region where protrusion 112 is not present on the circumference of the first circle is recess 113.

Note that it suffices that protrusion 112 is relatively protruded than recess 113, and that recess 113 is relatively recessed than protrusion 112. That is, it suffices that protrusion 112 can function as a pressing part, and that recess 113 can function as a non-pressing part. For example, in the example illustrated in FIG. 6B, protrusion 112 is protruded from the top surface (reference surface) of body 111, and the bottom surface of recess 113 is at the same height as the top surface (reference surface) of body 111. Conversely, the top surface of protrusion 112 may be at the same height as the top surface (reference surface) of body 111, and in this case, recess 113 is recessed from the top surface (reference surface) of body 111.

On the other hand, as illustrated in FIG. 4, washing solution valve control part 120 includes driving part 121 and contact part 122. Driving part 121 moves contact part 122 in the direction along central axis CA and switches between the state where contact part 122 presses diaphragm 234 of washing solution valve 232 and the state where contact part 122 does not press diaphragm 234 of washing solution valve 232. Driving part 121 presses diaphragm 234 of washing solution valve 232 by contact part 122 when closing washing solution valve 232, and driving part 121 does not press diaphragm 234 of washing solution valve 232 by contact part 122 when opening washing solution valve 232. In the present embodiment, driving part 121 is a solenoid actuator. Washing solution valve control part 120 is disposed such that contact part 122 is opposite to diaphragm 234 of washing solution valve 232. Washing solution valve control part 120 controls opening and closing of washing solution valve 232. As described later, washing solution valve control part 120 opens washing solution valve 232 to cause washing solution to flow in common channel 280 after rotary member 110 is rotated to open and close at least one valve (e.g., first introduction valve 242), and before rotary member 110 is rotated to open and close another valve (e.g., fourth introduction valve 272).

Operation of Fluid Handling Device

Figure 7:
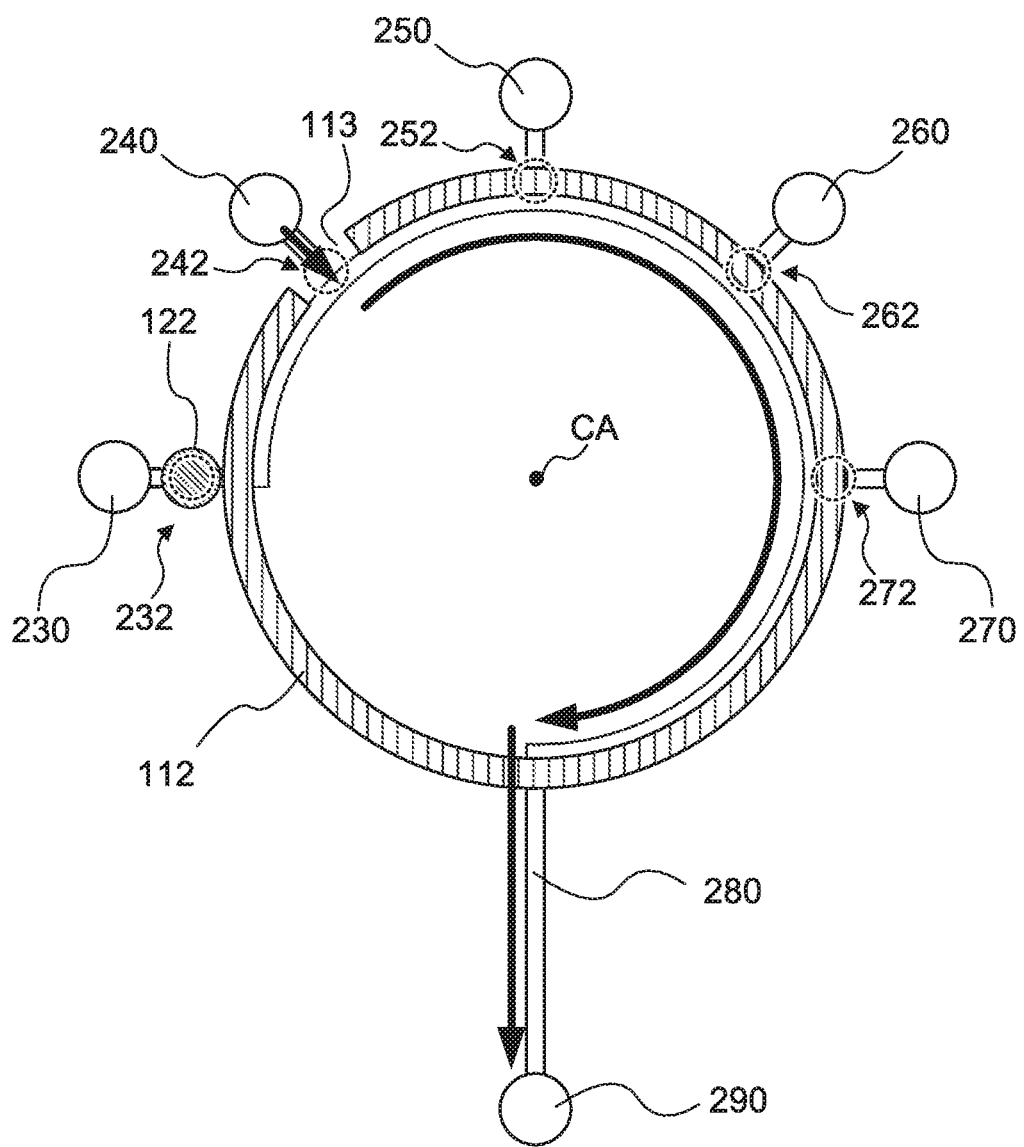
FIG. 7 is a schematic view for describing an operation of the fluid handling device according to Embodiment 1.
Figure 8:
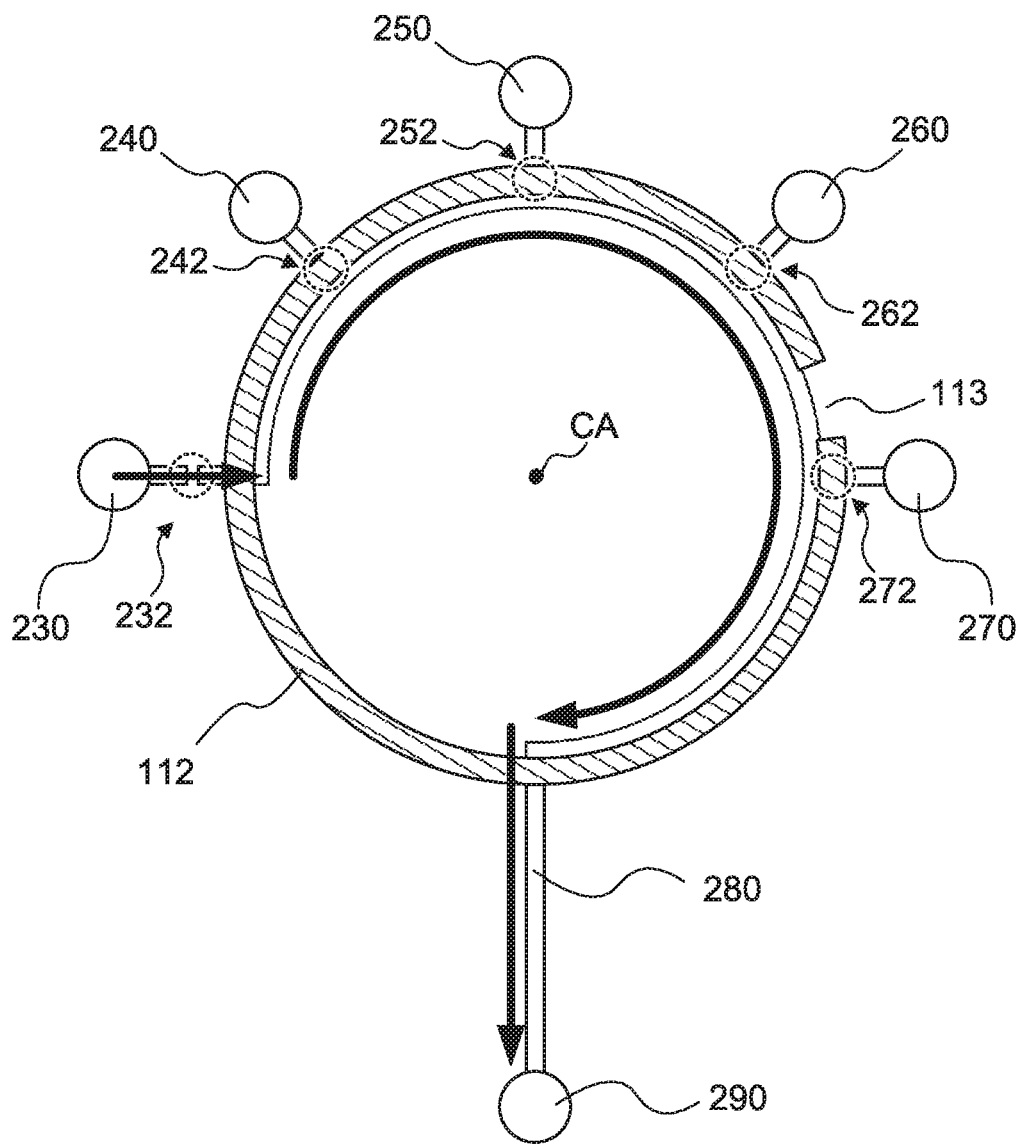
FIG. 8 is a schematic view for describing an operation of the fluid handling device according to Embodiment 1.
Figure 9:
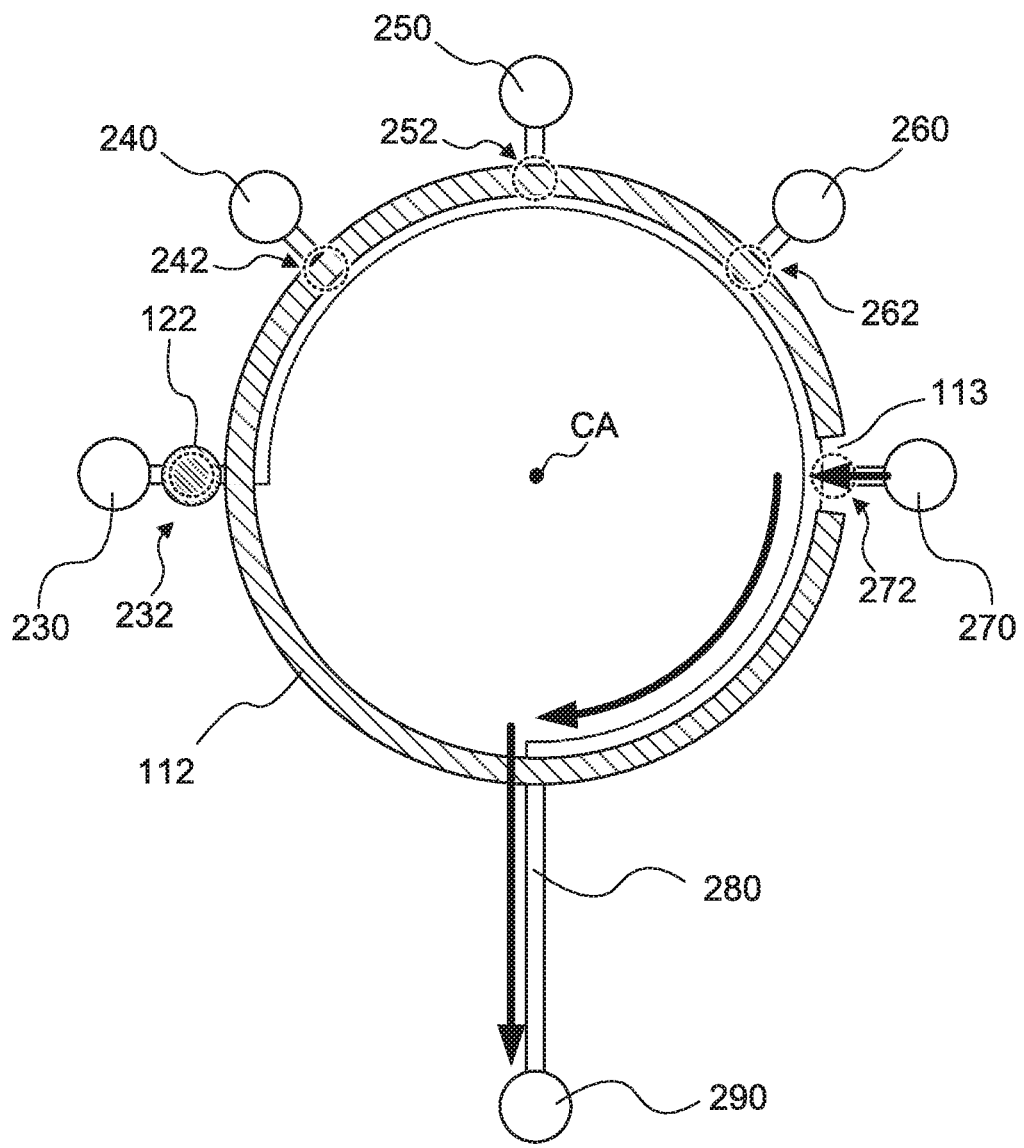
FIG. 9 is a schematic view for describing an operation of the fluid handling device according to Embodiment 1.

Next, with reference to FIGS. 7 to 9, an operation of fluid handling device 100 is described. For convenience of description, in FIGS. 7 to 9, protrusion 112 and contact part 122 are hatched when they are in contact with film 220 of channel chip 200, and are not hatched when they are not in contact with film 220 of channel chip 200. Assume that washing solution is housed in washing solution inlet 230, first liquid is housed in first inlet 240, second liquid is housed in second inlet 250, third liquid is housed in third inlet 260, and fourth liquid is housed in fourth inlet 270. In addition, assume that a pressure is exerted on washing solution inlet 230, first inlet 240, second inlet 250, third inlet 260 and fourth inlet 270.

First, washing solution valve control part 120 moves contact part 122 to press diaphragm 234, and thus closes washing solution valve 232. In addition, rotary member 110 (body 111) is rotated such that recess 113 is located over first introduction valve 242 and that protrusion 112 is located over second introduction valve 252, third introduction valve 262 and fourth introduction valve 272, to open first introduction valve 242 and close second introduction valve 252, third introduction valve 262 and fourth introduction valve 272. In this manner, as illustrated in FIG. 7, the first liquid in first inlet 240 moves to outlet 290 through first introduction channel 241, first introduction valve 242 and common channel 280. At this time, washing solution valve 232, second introduction valve 252, third introduction valve 262 and fourth introduction valve 272 are closed, and therefore the washing solution in washing solution inlet 230, the second liquid in second inlet 250, the third liquid in third inlet 260 and the fourth liquid in fourth inlet 270 do not flow into common channel 280.

Next, assume that the fourth liquid in fourth inlet 270 is caused to flow through common channel 280. In this case, rotary member 110 (body 111) is rotated until recess 113 is located close to fourth introduction valve 272. Here, rotary member 110 (body 111) is rotated such that recess 113 is not located over any of the valves, and recess 113 can be located over fourth introduction valve 272 to be opened next without passing over other valves (see FIG. 8). Note that since recess 113 passes over second introduction valve 252 and third introduction valve 262 while rotary member 110 (body 111) is being rotated, the second liquid in second inlet 250 and the third liquid in third inlet 260 may temporarily flow into common channel 280. However, as described later, since the interior of common channel 280 is washed with washing solution before fourth introduction valve 272 is opened, the unintentional temporary opening of the valve causes no particular problem.

After rotary member 110 (body 111) is rotated in the above-described manner, washing solution valve control part 120 opens washing solution valve 232 by moving contact part 122 so as not to press diaphragm 234. In this manner, as illustrated in FIG. 8, the washing solution in washing solution inlet 230 moves to outlet 290 through washing solution channel 231, washing solution valve 232 and common channel 280. Thus, the interior of common channel 280 is washed with washing solution. In addition, first introduction valve 242, second introduction valve 252, third introduction valve 262 and fourth introduction valve 272 are closed, therefore the first liquid in first inlet 240, the second liquid in second inlet 250, the third liquid in third inlet 260, and the fourth liquid in fourth inlet 270 do not flow into common channel 280.

Next, washing solution valve control part 120 moves contact part 122 to press diaphragm 234, and thus closes washing solution valve 232. In addition, rotary member 110 (body 111) is rotated such that recess 113 is located over fourth introduction valve 272 and that protrusion 112 is located over first introduction valve 242, second introduction valve 252 and third introduction valve 262. In this manner, only fourth introduction valve 272 is opened. In this manner, as illustrated in FIG. 9, the fourth liquid in fourth inlet 270 moves to outlet 290 through fourth introduction channel 271, fourth introduction valve 272 and common channel 280. At this time, washing solution valve 232, first introduction valve 242, second introduction valve 252 and third introduction valve 262 are closed, and therefore the washing solution in washing solution inlet 230, the first liquid in first inlet 240, the second liquid in second inlet 250, and the third liquid in third inlet 260 do not flow into common channel 280.

Through the above-mentioned procedure, the interior of common channel 280 is washed with washing solution immediately before opening the valve of interest, and it is thus possible to prevent unintentional mixing of a plurality of types of liquid in common channel 280 even when an unintended valve is temporarily opened while rotary member 110 (body 111) is being rotated.

Effect

As described above, with washing solution valve control part 120 provided separately from rotary member 110, fluid handling device 100 according to Embodiment 1 controls opening and closing of washing solution valve 232 dedicated for washing solution. Thus, even when an unintended valve is opened while rotary member 110 is rotated, fluid handling device 100 according to Embodiment 1 can prevent unintentional mixing of a plurality of types of liquid in common channel 280 by washing the interior of common channel 280 with washing solution.

Embodiment 2

Configuration of Fluid Handling Device and Channel Chip

Fluid handling device 300 according to Embodiment 2 is a fluid handling device configured to control the fluid in the channel of channel chip 200 illustrated in FIG. 5 (identical to channel chip 200 according to Embodiment 1). A fluid handling system (fluid handling device 300 and channel chip 200) according to Embodiment 2 differs from fluid handling device 100 and channel chip 200 according to Embodiment 1 in that the rotary member functions also as a washing solution valve control. The same components as those of fluid handling device 100 and channel chip 200 according to Embodiment 1 are denoted by the same reference numerals, and the descriptions thereof are omitted.

Figure 10:
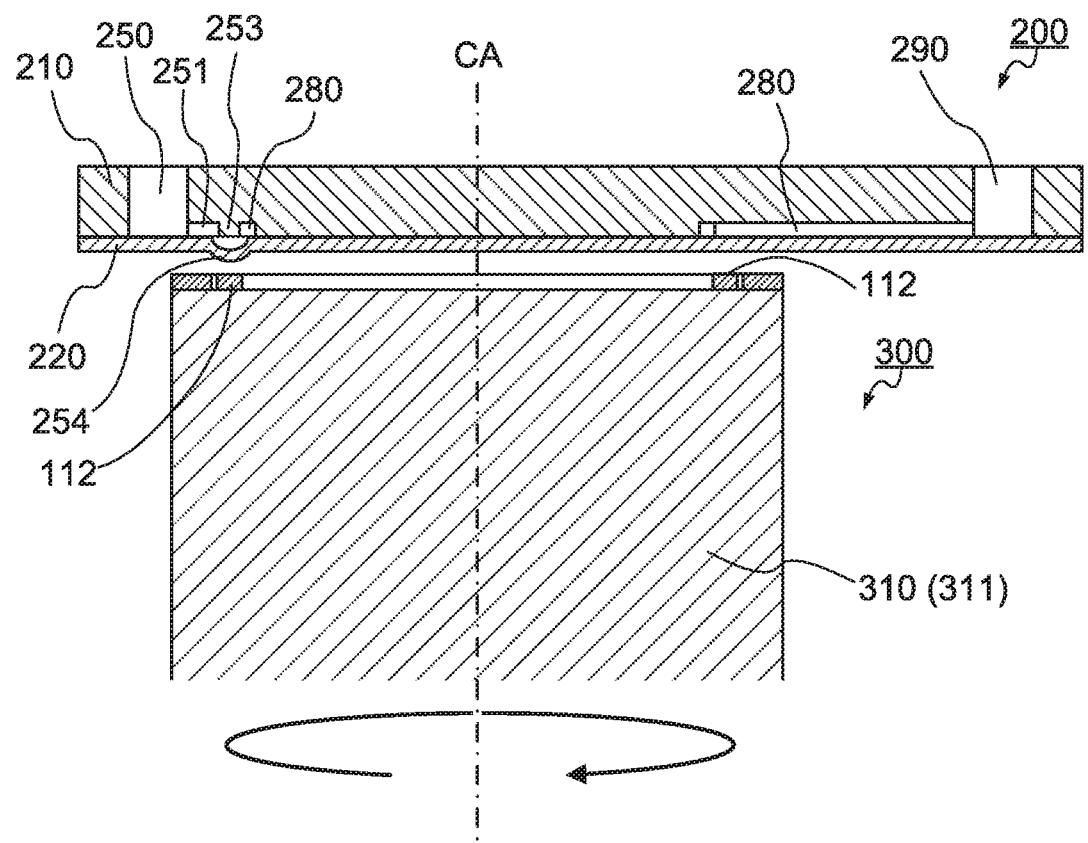
FIG. 10 is a sectional view illustrating a configuration of a fluid handling device and a channel chip according to Embodiment 2.
Figure 11:
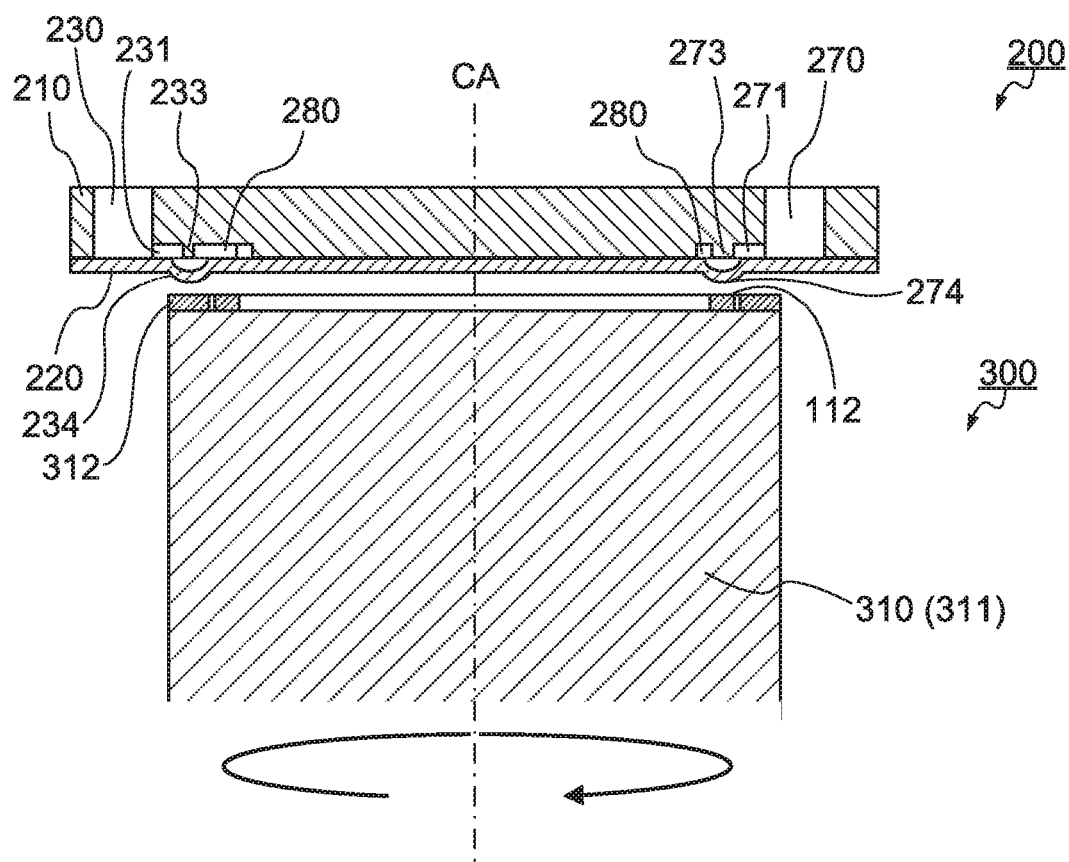
FIG. 11 is a sectional view illustrating a configuration of the fluid handling device and the channel chip according to Embodiment 2.

FIGS. 10 and 11 are sectional views illustrating a configuration of fluid handling device 300 and channel chip 200 according to Embodiment 2. FIG. 10 is a sectional view taken along line A-A of FIG. 5, and FIG. 11 is a sectional view taken along line B-B of FIG. 5. As illustrated in FIGS. 10 and 11, fluid handling device 300 includes rotary member 310. Rotary member 310 is rotated around central axis CA by an external driving mechanism not illustrated in the drawing. Channel chip 200 is disposed to fluid handling device 300 such that film 220 makes contact with rotary member 310. Note that in FIGS. 10 and 11, fluid handling device 300 and channel chip 200 are separated away from each other for the same of clarity of the configuration.

Figure 12A:
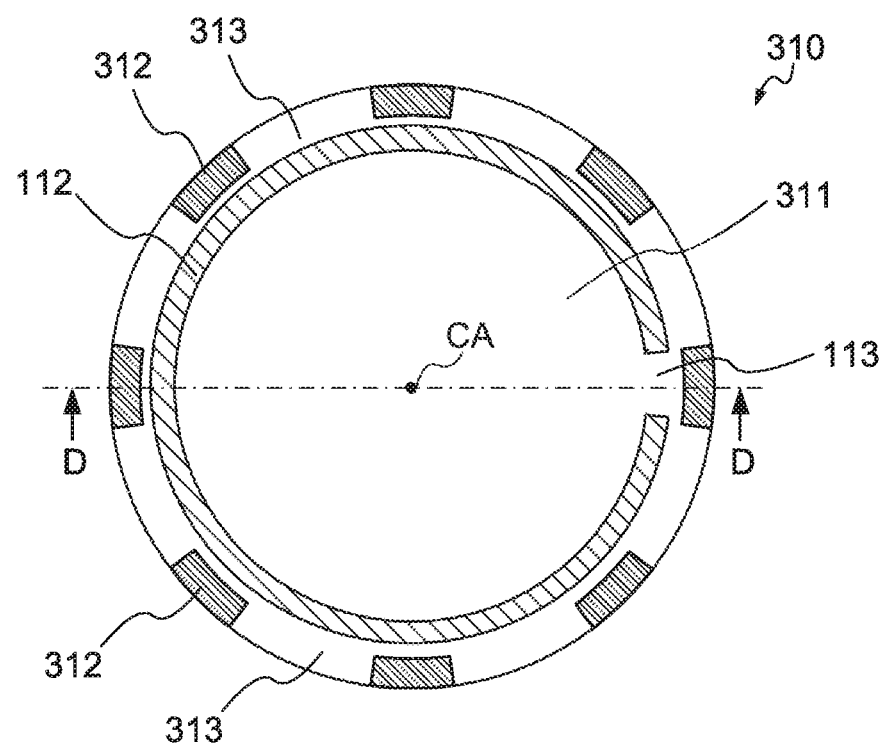
FIG. 12A is a plan view of the rotary member of the fluid handling device according to Embodiment 2.
Figure 12B:
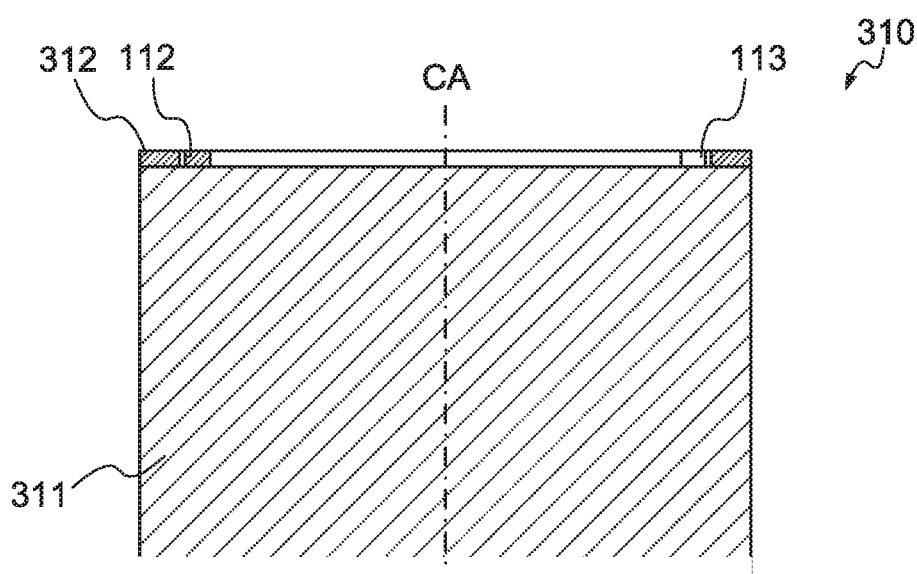
FIG. 12B is a sectional view taken along line D-D of FIG. 12A.

FIG. 12A is a plan view of rotary member 310 of fluid handling device 300 according to Embodiment 2, and FIG. 12B is a sectional view taken along line D-D of FIG. 12A. In FIG. 12A, for the sake of clarity, the top surface of first protrusion 112 and the top surface of second protrusion 312 are hatched.

Rotary member 310 includes columnar body 311, and first protrusion 112, first recess 113, a plurality of second protrusions 312 and a plurality of second recesses 313 disposed in the top surface of body 311. First protrusion 112 and first recess 113 are identical to protrusion 112 and recess 113 of fluid handling device 100 according to Embodiment 1. Body 311 is rotatable around central axis CA. Body 311 is rotated by an external driving mechanism not illustrated in the drawing.

In the upper part of body 311, first protrusion 112 configured to close first introduction valve 242, second introduction valve 252, third introduction valve 262 or fourth introduction valve 272 by pressing first diaphragm 244, second diaphragm 254, third diaphragm 264 or fourth diaphragm 274, and first recess 113 configured to open these introduction valves without pressing the diaphragms are provided. First protrusion 112 and first recess 113 are disposed on the circumference of the first circle around central axis CA. In the present embodiment, first protrusion 112 has an arc-like shape corresponding to a portion of the first circle around central axis CA in plan view. The region where first protrusion 112 is not present on the circumference of the first circle is first recess 113.

Note that it suffices that first protrusion 112 is relatively protruded than first recess 113, and that first recess 113 is relatively recessed than first protrusion 112. That is, it suffices that first protrusion 112 can function as a pressing part, and that first recess 113 can function as a non-pressing part. For example, in the example illustrated in FIG. 12B, first protrusion 112 is protruded from the top surface (reference surface) of body 311, and the bottom surface of first recess 113 is at the same height as the top surface (reference surface) of body 311. Conversely, the top surface of first protrusion 112 may be at the same height as the top surface (reference surface) of body 311, and in this case, first recess 113 is recessed from the top surface of body 311 (reference surface).

In addition, in the upper part of body 311, the plurality of second protrusions 312 configured to close washing solution valve 232 by pressing diaphragm 234, and the plurality of second recesses 313 configured to open washing solution valve 232 without pressing diaphragm 234 are provided. In the present embodiment, second protrusion 312 and second recess 313 function as washing solution valve control parts for controlling the opening and closing of washing solution valve 232. As described later, the washing solution valve control part (the plurality of second protrusions 312 and the plurality of second recesses 313) opens washing solution valve 232 such that washing solution flows through common channel 280 after rotary member 310 is rotated to open and close at least one valve (e.g., first introduction valve 242), and before rotary member 310 is rotated to open and close another valve (e.g., fourth introduction valve 272).

The plurality of second protrusions 312 and the plurality of second recesses 313 are disposed on the circumference of the second circle around central axis CA. In the present embodiment, the plurality of second protrusions 312 and the plurality of second recesses 313 are disposed on the circumference of a second circle around central axis CA outside the first circle. In the present embodiment, each of the plurality of second protrusions 312 has an arc-like shape corresponding to a portion of the second circle around central axis CA in plan view. The region where second protrusion 431 is not present on the circumference of the second circle is second recess 313. The plurality of second protrusions 312 is disposed such that the plurality of second protrusions 312 is located over washing solution valve 232 when first recess 113 is located over first diaphragm 244, second diaphragm 254, third diaphragm 264 or fourth diaphragm 274. On the other hand, the plurality of second recesses 313 is disposed such that the plurality of second recesses 313 is located over washing solution valve 232 when first protrusion 112 is located over first diaphragm 244, second diaphragm 254, third diaphragm 264 and fourth diaphragm 274.

Note that it suffices that second protrusion 312 is relatively protruded than second recess 313, and that second recess 313 is relatively recessed than second protrusion 312. That is, it suffices that second protrusion 312 can function as a pressing part, and that second recess 313 can function as a non-pressing part. For example, in the example illustrated in FIG. 12B, second protrusion 312 is protruded from the top surface (reference surface) of body 311, and the bottom surface of second recess 313 is at the same height as the top surface (reference surface) of body 311. Conversely, the top surface of second protrusion 312 may be at the same height as the top surface (reference surface) of body 311, and in this case, second recess 313 is recessed from the top surface (reference surface) of body 311.

Operation of Fluid Handling Device

Figure 13:
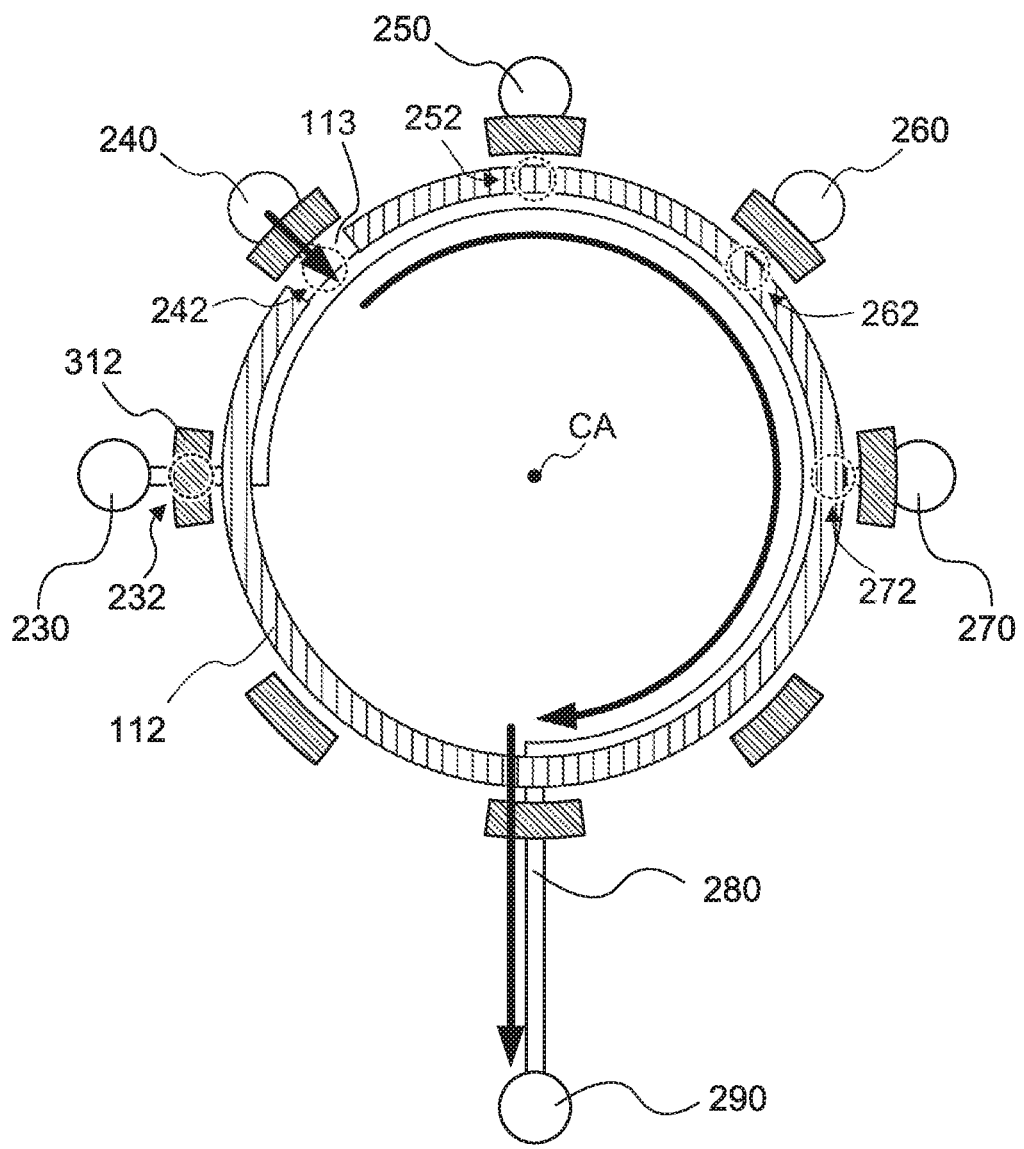
FIG. 13 is a schematic view for describing an operation of the fluid handling device according to Embodiment 2.
Figure 14:
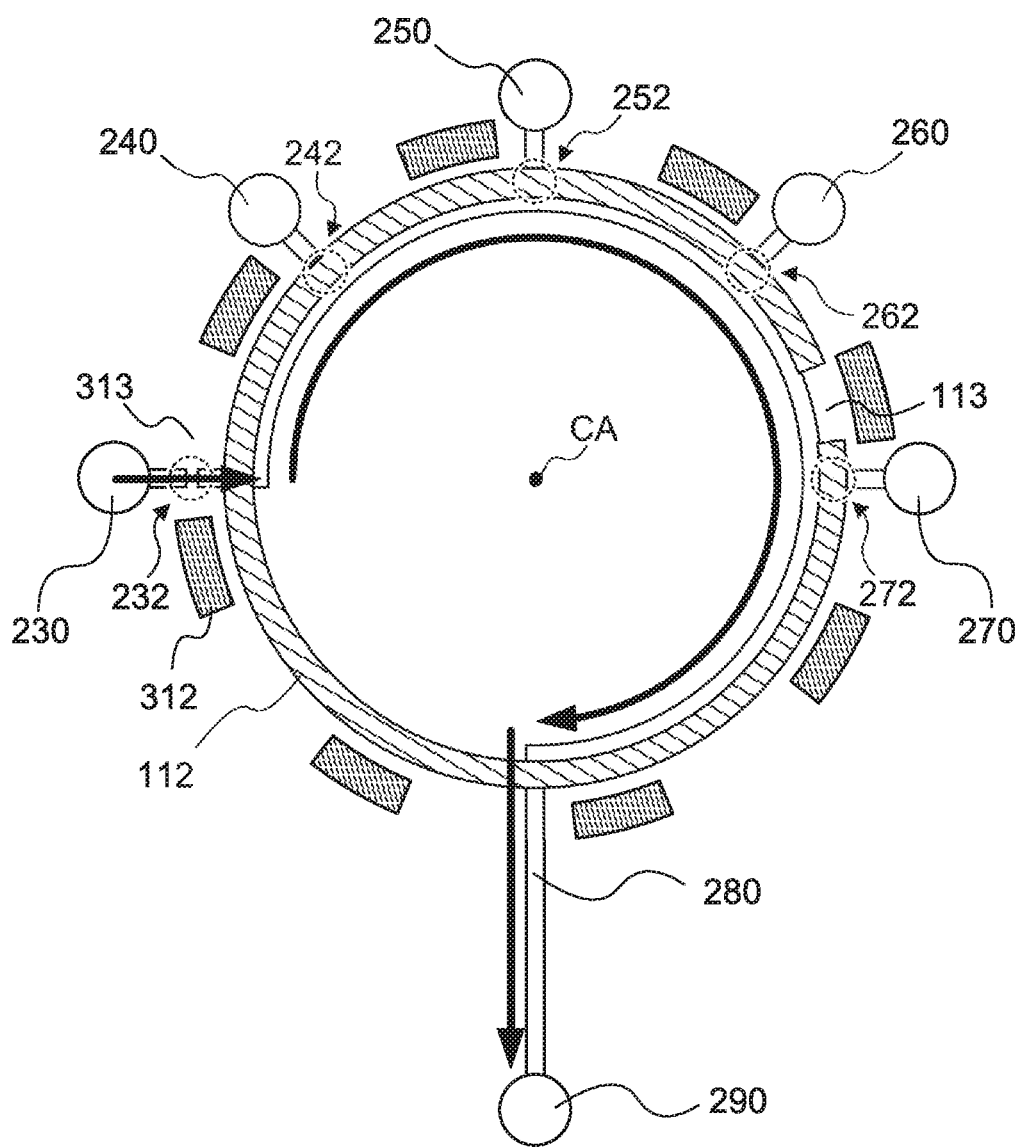
FIG. 14 is a schematic view for describing an operation of the fluid handling device according to Embodiment 2.
Figure 15:
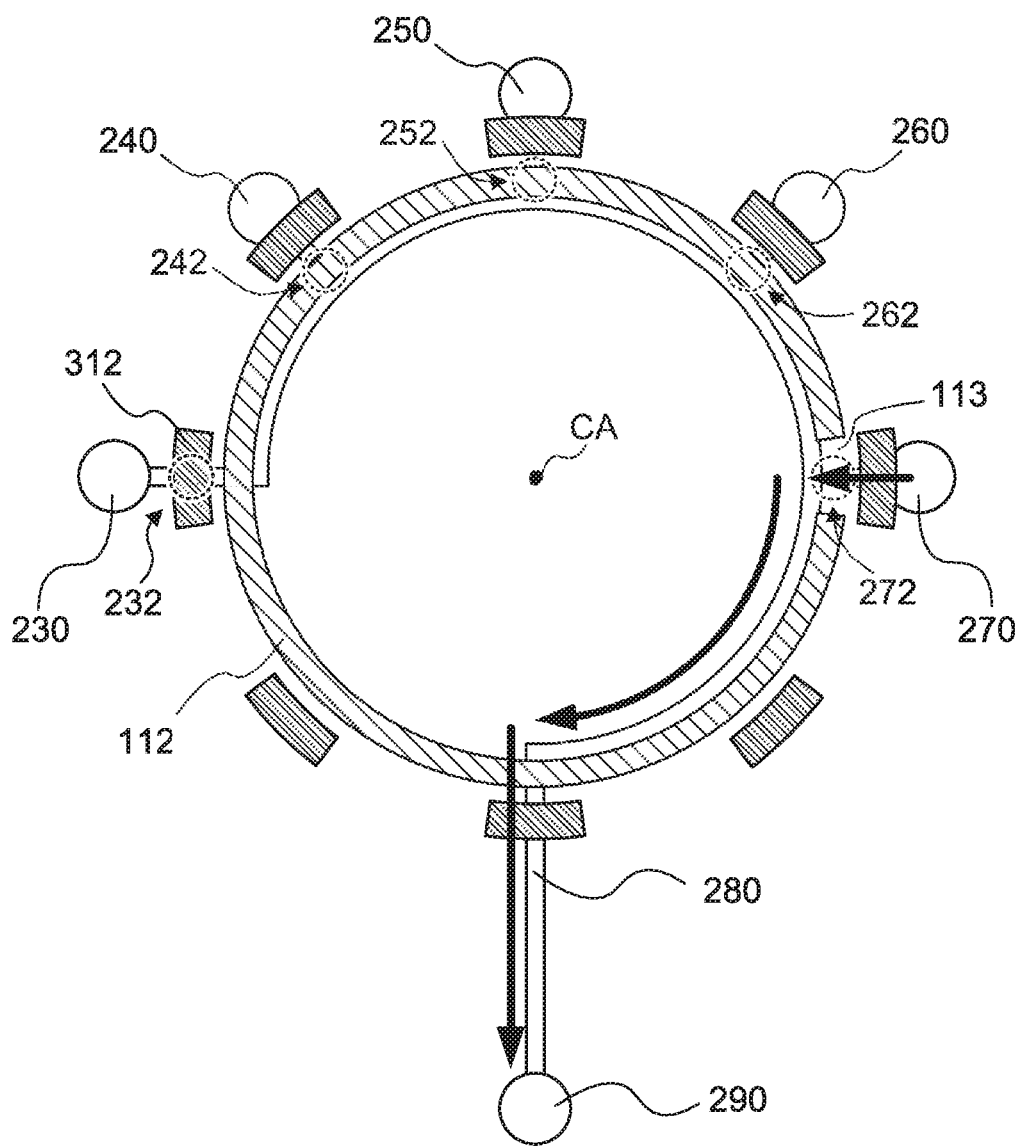
FIG. 15 is a schematic view for describing an operation of the fluid handling device according to Embodiment 2.

Next, with reference to FIGS. 13 to 15, an operation of fluid handling device 100 is described. For convenience of description, in FIGS. 13 to 15, first protrusion 112 and second protrusion 312 are hatched when they are in contact with film 220 of channel chip 200, and are not hatched when they are not in contact with film 220 of channel chip 200. Assume that washing solution is housed in washing solution inlet 230, first liquid is housed in first inlet 240, second liquid is housed in second inlet 250, third liquid is housed in third inlet 260, and fourth liquid is housed in fourth inlet 270. In addition, assume that a pressure is exerted on washing solution inlet 230, first inlet 240, second inlet 250, third inlet 260 and fourth inlet 270.

First, rotary member 310 (body 311) is rotated such that first recess 113 is located over first introduction valve 242 and that first protrusion 112 is located over second introduction valve 252, third introduction valve 262 and fourth introduction valve 272, to open first introduction valve 242 and close second introduction valve 252, third introduction valve 262 and fourth introduction valve 272. When rotary member 310 (body 311) is rotated in the above-described manner, second protrusion 312 is located over washing solution valve 232 and washing solution valve 232 is also closed. As a result, as illustrated in FIG. 13, the first liquid in first inlet 240 moves to outlet 290 through first introduction channel 241, first introduction valve 242 and common channel 280. At this time, washing solution valve 232, second introduction valve 252, third introduction valve 262 and fourth introduction valve 272 are closed, and therefore the washing solution in washing solution inlet 230, the second liquid in second inlet 250, the third liquid in third inlet 260 and the fourth liquid in fourth inlet 270 do not flow into common channel 280.

Next, assume that the fourth liquid in fourth inlet 270 is caused to flow through common channel 280. In this case, rotary member 310 (body 311) is rotated until first recess 113 is located close to fourth introduction valve 272. Here, rotary member 310 (body 311) is rotated such that first recess 113 is not located over any of the valves, and can be located over fourth introduction valve 272 to be opened next without passing over other valves (see FIG. 14). Note that since first recess 113 passes over second introduction valve 252 and third introduction valve 262 while rotary member 310 (body 311) is being rotated, the second liquid in second inlet 250 and the third liquid in third inlet 260 may temporarily flow into common channel 280. However, as described later, since the interior of common channel 280 is washed with washing solution before fourth introduction valve 272 is opened, the unintentional temporary opening of the valve causes no particular problem.

When rotary member 310 (body 311) is rotated in the above-described manner, second recess 313 is located over washing solution valve 232, and washing solution valve 232 is opened. As a result, as illustrated in FIG. 14, the washing solution in washing solution inlet 230 moves to outlet 290 through washing solution channel 231, washing solution valve 232 and common channel 280. Accordingly, the interior of common channel 280 is washed with washing solution. In addition, first introduction valve 242, second introduction valve 252, third introduction valve 262 and fourth introduction valve 272 are closed, and therefore the first liquid in first inlet 240, the second liquid in second inlet 250, the third liquid in third inlet 260, and the fourth liquid in fourth inlet 270 do not flow into common channel 280.

Then, rotary member 310 (body 311) is rotated such that first recess 113 is located over fourth introduction valve 272 and that first protrusion 112 is located over first introduction valve 242, second introduction valve 252 and third introduction valve 262. When rotary member 310 (body 311) is rotated in the above-mentioned manner, second protrusion 312 is located over washing solution valve 232, and washing solution valve 232 is also closed. As a result, only fourth introduction valve 272 is opened. In this manner, as illustrated in FIG. 15, the fourth liquid in fourth inlet 270 moves to outlet 290 through fourth introduction channel 271, fourth introduction valve 272 and common channel 280. At this time, washing solution valve 232, first introduction valve 242, second introduction valve 252 and third introduction valve 262 are closed, and therefore the washing solution in washing solution inlet 230, the first liquid in first inlet 240, the second liquid in second inlet 250, and the third liquid in third inlet 260 do not flow into common channel 280.

Through the above-mentioned procedure, the interior of common channel 280 is washed with washing solution immediately before opening the valve of interest, and it is thus possible to prevent unintentional mixing of a plurality of types of liquid in common channel 280 even when an unintended valve is temporarily opened while rotary member 310 (body 311) is being rotated.

Effect

Fluid handling device 300 according to Embodiment 2 has an effect similar to that of fluid handling device 100 according to Embodiment 1.

This application is entitled to and claims the benefit of Japanese Patent Application No. 2018-065032 filed on Mar. 29, 2018, the disclosure each of which including the specification, drawings and abstract is incorporated herein by reference in its entirety.

INDUSTRIAL APPLICABILITY

The fluid handling device of the embodiment of the present invention is suitable for various uses such as laboratory tests, food tests, and environment tests, for example.

REFERENCE SIGNS LIST

10 First inlet
11 First introduction channel
12 First valve
20 Second inlet
21 Second introduction channel
22 Second valve
30 Third inlet
31 Third introduction channel
32 Third valve
40 Common channel
41 Outlet
50 Protrusion of rotary member
51 Recess of rotary member
100 Fluid handling device
110, 310 Rotary member
111, 311 Body
112 Protrusion, First protrusion
113 Recess, First recess
120 Washing solution valve control part
121 Driving part
122 Contact part
200 Channel chip
210 Substrate
220 Film
230 Washing solution inlet
231 Washing solution channel
232 Washing solution valve
233 Partition wall
234 Diaphragm
240 First inlet
241 First introduction channel
242 First introduction valve
243 First partition wall
244 First diaphragm
250 Second inlet
251 Second introduction channel
252 Second introduction valve
253 Second partition wall
254 Second diaphragm
260 Third inlet
261 Third introduction channel
262 Third introduction valve 263 Third partition wall
264 Third diaphragm
270 Fourth inlet
271 Fourth introduction channel
272 Fourth introduction valve
273 Fourth partition wall
274 Fourth diaphragm
280 Common channel
290 Outlet
312 Second protrusion
313 Second recess
CA Central axis

What is claimed is:

1. A fluid handling device configured to control fluid in a channel of a channel chip,
wherein the channel chip includes:
a common channel;
a plurality of introduction channels connected to the common channel;
a plurality of introduction valves disposed for the plurality of introduction channels, each of the plurality of introduction valves being disposed in each of the plurality of introduction channels or at a connecting portion between each of the plurality of introduction channels and the common channel, the plurality of introduction valves being disposed on a circumference of a first circle around a central axis;
a washing solution channel connected to the common channel at a position upstream of the plurality of introduction channels; and
a washing solution valve disposed in the washing solution channel or a connecting portion between the washing solution channel and the common channel;
wherein the fluid handling device includes a rotary member rotatable around the central axis, the rotary member including:
a first protrusion configured to close the plurality of introduction valves by pressing a diaphragm of each of the plurality of introduction valves;
a first recess configured to open the plurality of introduction valves without pressing the diaphragm of each of the plurality of introduction valves, the first protrusion and the first recess being disposed on a circumference of a second circle around the central axis; and
a washing solution valve control part configured to control opening and closing of the washing solution valve; and
wherein the washing solution valve control part opens the washing solution valve to cause washing solution to flow in the common channel after the rotary member is rotated to open and close an introduction valve of the plurality of introduction valves and before the rotary member is rotated to open and close another introduction valve of the plurality of introduction valves.

2. The fluid handling device according to claim 1,
wherein the washing solution valve control part includes:
a contact part configured to be brought into contact with a diaphragm of the washing solution valve; and
a driving part configured to move the contact part in a direction along the central axis;
wherein the driving part presses the diaphragm of the washing solution valve by the contact part when closing the washing solution valve; and
wherein the driving part does not press the diaphragm of the washing solution valve by the contact part when opening the washing solution valve.

3. The fluid handling device according to claim 2, wherein the driving part is a solenoid actuator.

4. The fluid handling device according to claim 1,
wherein the washing solution valve control part is a second protrusion and a second recess that are disposed on a circumference of a third circle around the central axis in a surface where the first protrusion and the first recess are disposed in the rotary member;
wherein the second protrusion is configured to close the washing solution valve by pressing a diaphragm of the washing solution valve; and
wherein the second recess is configured to open the washing solution valve without pressing the diaphragm of the washing solution valve.

5. A fluid handling system, comprising:
the channel chip; and
the fluid handling device according to claim 1;
wherein the channel chip includes:
the common channel;
the plurality of introduction channels connected to the common channel;
the plurality of introduction valves disposed for the plurality of introduction channels, each of the plurality of introduction valves being disposed in each of the plurality of introduction channels or at the connecting portion between each of the plurality of introduction channels and the common channel, the plurality of introduction valves being disposed on the circumference of the first circle;
the washing solution channel connected to the common channel at the position upstream of the plurality of introduction channels; and
the washing solution valve disposed in the washing solution channel or at the connecting portion between the washing solution channel and the common channel.

* * * * *